US011063577B2

(12) United States Patent
Vulpoiu et al.

(10) Patent No.: US 11,063,577 B2
(45) Date of Patent: Jul. 13, 2021

(54) PULSE WIDTH MODULATION TECHNIQUE WITH TIME-RATIO DUTY CYCLE COMPUTATION

(71) Applicant: TEXAS INSTRUMENTS INCORPORATED, Dallas, TX (US)

(72) Inventors: Paul Vulpoiu, Allen, TX (US); Rakesh Raja, Allen, TX (US); Sudhir Nagaraj, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/896,902

(22) Filed: Jun. 9, 2020

(65) Prior Publication Data
US 2020/0304109 A1 Sep. 24, 2020

Related U.S. Application Data

(62) Division of application No. 15/791,026, filed on Oct. 23, 2017, now Pat. No. 10,707,842.

(51) Int. Cl.
*H03K 3/017* (2006.01)
*H03K 21/08* (2006.01)
*H03K 5/24* (2006.01)
*H03K 7/08* (2006.01)
*H03K 4/08* (2006.01)

(52) U.S. Cl.
CPC .............. *H03K 3/017* (2013.01); *H03K 5/24* (2013.01); *H03K 7/08* (2013.01); *H03K 21/08* (2013.01); *H03K 4/08* (2013.01)

(58) Field of Classification Search
CPC .......... H03K 3/017; H03K 4/08; H03K 21/08; H03K 5/24; H03K 7/08
See application file for complete search history.

(56) References Cited

U.S. PATENT DOCUMENTS 8,749,209 B2 6/2014 Feldtkeller
9,059,632 B2 6/2015 Li

*Primary Examiner* — Jung Kim
(74) *Attorney, Agent, or Firm* — Lawrence J. Bassuk; Charles A. Brill; Frank D. Cimino

(57) ABSTRACT

An analog signal-to-pulse width modulation (PWM) converter includes a ramp generator generating a ramp signal and a comparator circuit comparing the ramp signal to a first voltage, a second voltage, and to an analog input signal. A duty cycle calculation circuit generates a first control signal to the ramp generator to generate the ramp signal. Based on signals from the comparator circuit, the duty cycle calculation circuit calculates the ratio of the time it takes for the ramp signal to exceed the analog input signal from when the ramp signal exceeds the first voltage to the time it takes for the ramp signal to exceed the second voltage from when the ramp signal exceeds the first voltage. A PWM signal generator generates a PWM output signal based on the ratio calculated by the duty cycle calculation circuit.

15 Claims, 10 Drawing Sheets

PULSE WIDTH MODULATION TECHNIQUE WITH TIME-RATIO DUTY CYCLE COMPUTATION

This application is a divisional of prior application Ser. No. 15/791,026, filed Oct. 23, 2017, now U.S. Pat. No. 10,707,842, issued Jul. 7, 2020.

BACKGROUND

In some applications, an analog signal is converted into a pulse width modulation (PWM) output signal. For example, some sensors, generate an analog output signal representative of a physical condition, and the sensor's analog output signal is converted into a PWM output signal that encodes the analog output signal.

SUMMARY

In one embodiment, an analog signal-to-PWM converter includes a ramp generator to generate a ramp signal and a comparator circuit to compare the ramp signal to a first voltage, a second voltage, and to an analog input signal. A duty cycle calculation circuit generates a first control signal to the ramp generator to cause the ramp generator circuit to generate the ramp signal. Based on signals from the comparator circuit, the duty cycle calculation circuit calculates the ratio of the time it takes for the ramp signal to exceed the analog input signal from when the ramp signal exceeds the first voltage to the time it takes for the ramp signal to exceed the second voltage from when the ramp signal exceeds the first voltage. A PWM signal generator generates a PWM output signal based, at least in part, on the ratio calculated by the duty cycle calculation circuit.

In another embodiment, an analog signal-to-PWM converter includes a ramp generator configured to generate a ramp signal, a comparator circuit configured to compare the ramp signal to a first voltage, a second voltage, and to an analog input signal and a digital core coupled to the comparator circuit. The digital core is configured to generate a first control signal to the ramp generator to cause the ramp generator circuit to generate the ramp signal. Based on signals from the comparator circuit, the digital core is configured to calculate a ratio of the time it takes for the ramp signal to exceed the analog input signal from when the ramp signal exceeds the first voltage to the time it takes for the ramp signal to exceed the second voltage from when the ramp signal exceeds the first voltage. The digital core also is configured to generate a PWM output signal based, at least in part, on the ratio.

In another embodiment, a method includes generating a ramp signal, comparing the ramp signal to a first voltage to generate a first compare signal, comparing the ramp signal to a second voltage to generate a second compare signal, and comparing the ramp signal to an analog input signal to generate a third compare signal. Based on the first, second and third compare signals, the method includes calculating a ratio of the time it takes for the ramp signal to exceed the analog input signal from when the ramp signal exceeds the first voltage to the time it takes for the ramp signal to exceed the second voltage from when the ramp signal exceeds the first voltage. The method further includes generating a PWM output signal based, at least in part, on the ratio.

BRIEF DESCRIPTION OF THE DRAWINGS

For a detailed description of various examples, reference will now be made to the accompanying drawings in which.

DETAILED DESCRIPTION

Figure 1:
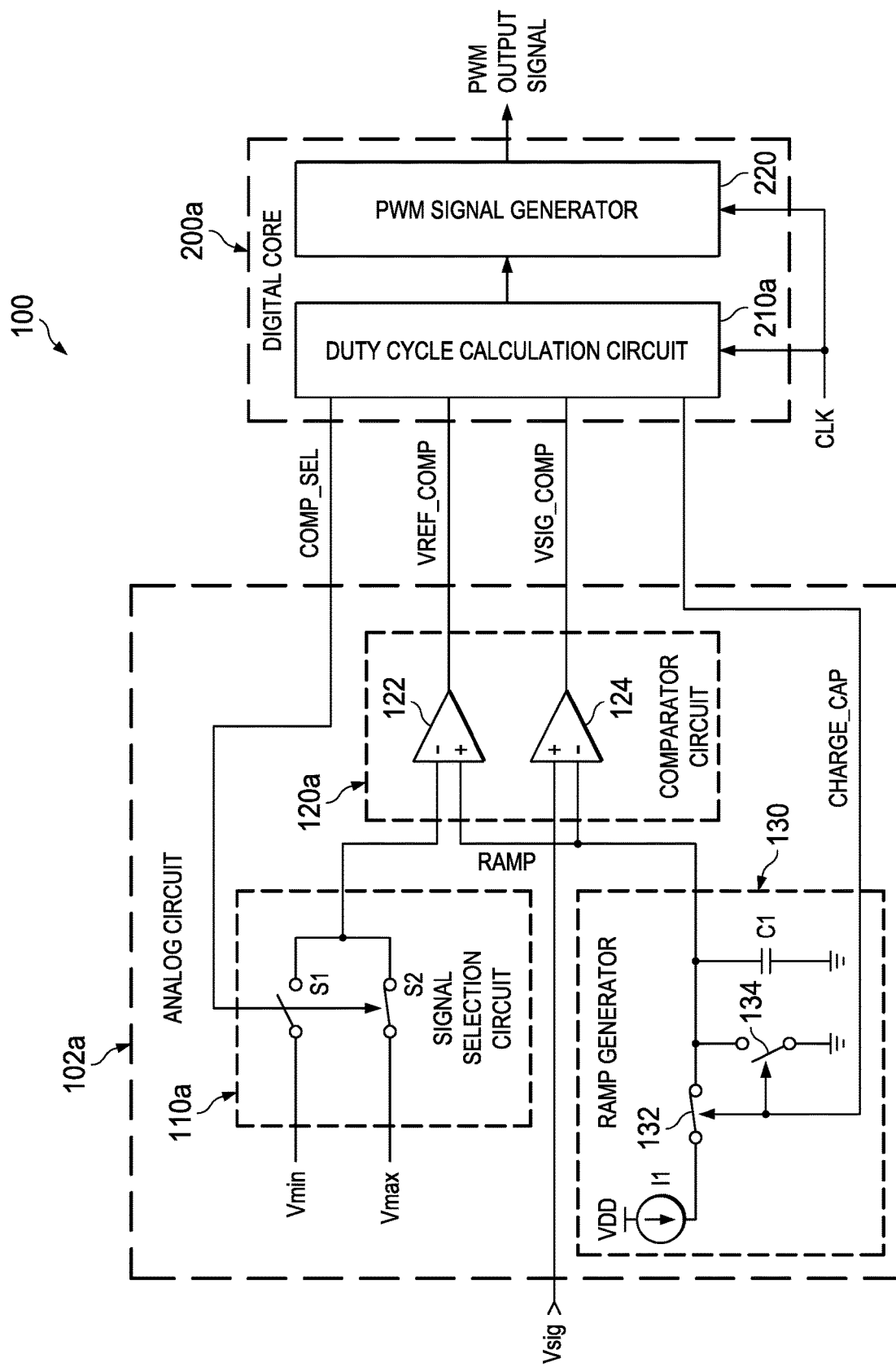
FIG. 1 illustrates an example of an analog-to-PWM converter including a signal selection circuit, a pair of comparators and a digital core.

FIG. 1 is a block diagram of an analog signal-to-PWM converter 100 in accordance with an embodiment. In the example of FIG. 1, the analog signal-to-PWM converter 100 includes an analog circuit 102a coupled to a digital core 200a. The analog circuit 102a receives an analog input signal Vsig and the digital core 200a generates a corresponding PWM output signal. The magnitude of Vsig is encoded in the duty cycle of the PWM output signal.

The analog circuit 102a of the example of FIG. 1 includes a signal selection circuit 110a, comparator circuit 120a, and a ramp generator 130. The digital core 200a includes a duty cycle calculator circuit 210a coupled to a PWM signal generator 220. The ramp generator 130 within the analog circuit 102a includes a capacitor C1, a current source I1, and switches 132 and 134. A control signal CHARGE_CAP generated by the digital core 200a (e.g., generated by the duty cycle calculation circuit 210a within the digital core 200a) controls the switches 132 and 134. The ramp generator 130 generates a ramp signal (RAMP), which is a voltage that increases generally linearly when switch 132 is closed and switch 134 thereby permitting current from the current source I1 to charge the capacitor C1. The ramp signal then decreases generally linearly when switch 132 is open and switch 134 is closed thereby providing a current path to ground for the capacitor C1 to discharge. The control signal CHARGE_CAP controls the states of switches 132 and 134 to cause RAMP to be generated.

The signal selection circuit 110a in this example includes switches S1 and S2 which are configured by a control signal COMP_SEL from the duty cycle calculation circuit 210a to select between a voltage Vmin and another voltage Vmax. In one example, COMP_SEL being at a high logic level causes switch S1 to be on and switch S2 to be off, and COMP_SEL being low turns S1 off and S2 on. The polarity can be the reverse as well in other embodiments (i.e., COMP_SEL low turns on S1 and turns off S2 while high turns S1 off and S2 on). Voltage Vmin is set to be less than or equal to Vsig, and voltage Vmax is set to be greater than or equal to Vsig. That is, Vmin≤Vsig≤Vmax. Ramp generator circuits generate a generally linear ramp signal, but the lower voltage level of the ramp signal may not be adequately linear. Vmin (and Vmax as well) is set to be in the generally linear region of the ramp signal (RAMP). The control signal COMP_SEL serially causes Vmin from the signal selection circuit 110a to be provided to the comparator circuit 120a for comparison to RAMP, followed by Vmax being provided to the comparator circuit 120a.

Referring still to the example of FIG. 1, the comparator circuit 120a includes two comparators—comparator 122 and comparator 124. The positive input of comparator 122 and the negative input of comparator 124 receive RAMP as an input signal. The negative input of comparator 122 receives the selected voltage (Vmin or Vmax) from the signal selection circuit 110a. The positive input of comparator 124 receives Vsig. As such, comparator 122 compares RAMP to the selected Vmin or Vmax voltage from the signal selection circuit, and comparator 124 compares RAMP to Vsig. The output of comparator 122 is designated as the VREF_COMP signal and the output of comparator 124 is designated as the VSIG_COMP signal. Based on the VREF_COMP and VSIG_COMP signals from the comparator circuit 120a, the duty cycle calculation circuit 210a calculates a ratio of the time it takes for RAMP to exceed the analog input signal Vsig from when RAMP exceeds Vmin to the time it takes for RAMP to exceed Vmax from when RAMP exceeds Vmin.

Figure 2:
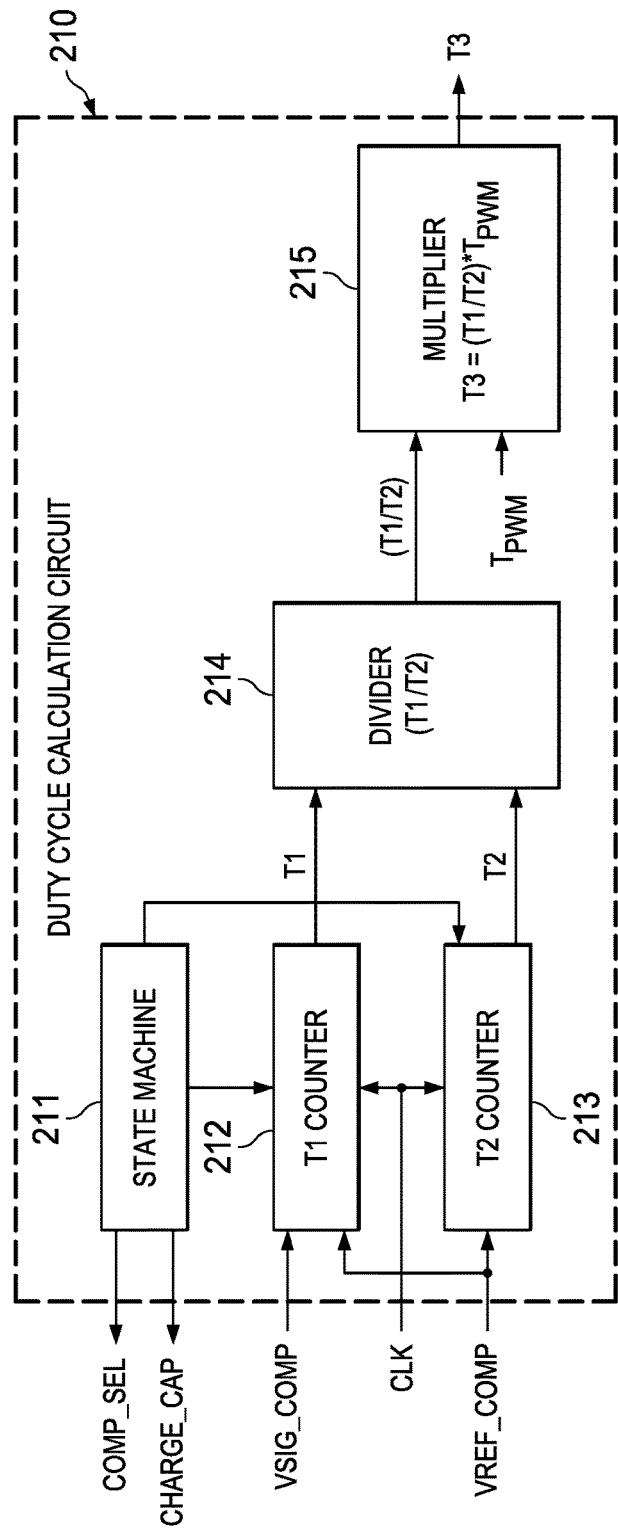
FIG. 2 provides a duty cycle calculation circuit of the illustrative digital core of FIG. 1.

The duty cycle calculation circuit 210a and the PWM signal generator 220 each receive a clock signal (CLK) for use in measuring time as explained below and generating the PWM output signal. FIG. 2 shows an example of the duty cycle calculation circuit 210a. The duty cycle calculation circuit 210a includes a state machine 211, a T1 counter 212, a T2 counter 213, a divider 214, and a multiplier 215. The state machine 211 generates the COMP_SEL and CHARGE_CAP control signals and also generates control signals for controlling the counters 212 and 213, divider 214 and multiplier 215.

Figure 3:
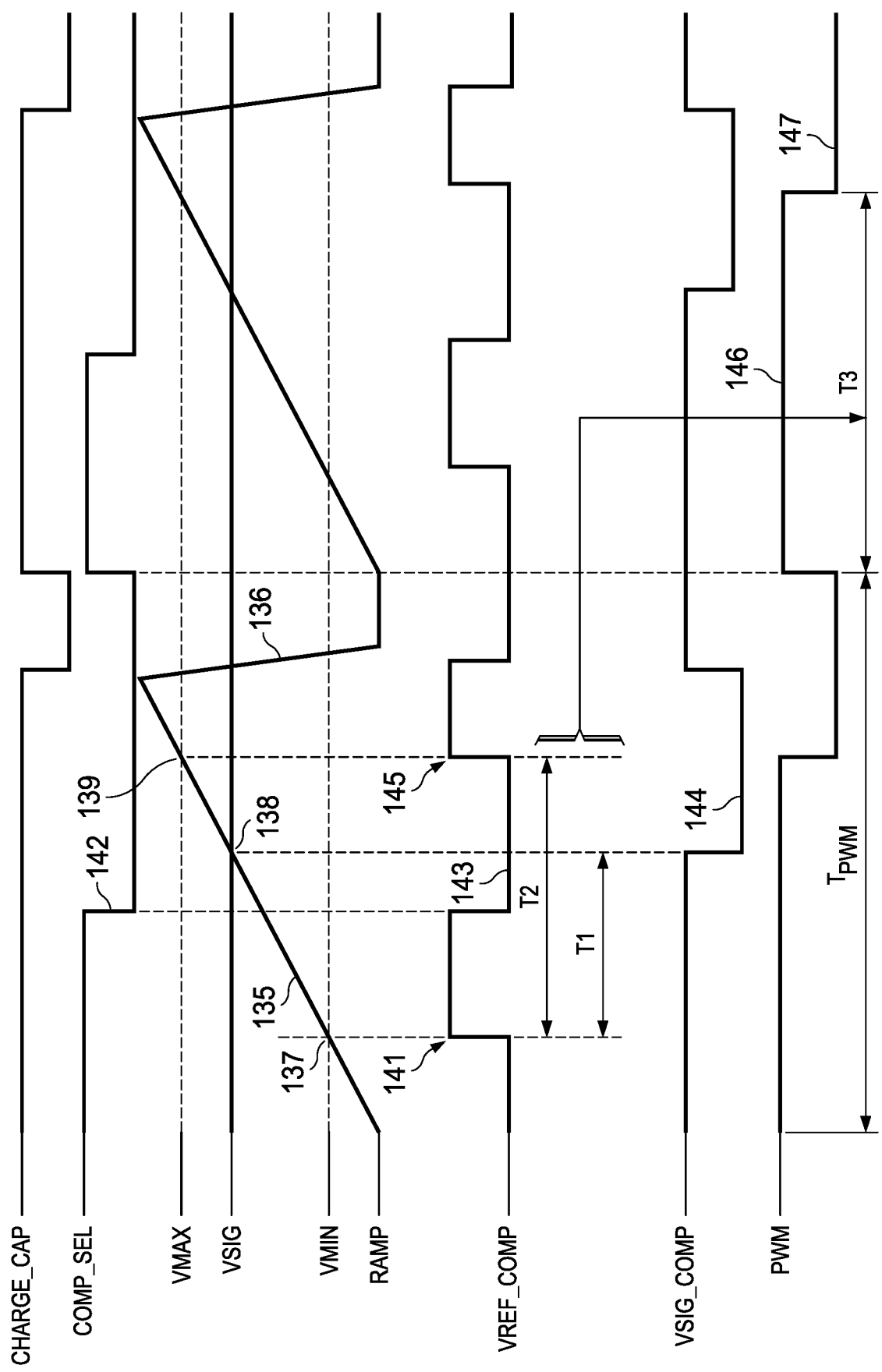
FIG. 3 is a timing diagram of the operation of the analog-to-PWM converter in accordance with an embodiment.

The use of the counters 212, 213 is now described with reference also to the timing diagram of FIG. 3. The signals depicted in FIG. 3 includes the CHARGE_CAP control signal which, when high in this example, causes the current source I1 to charge capacitor C1 thereby generating an upwardly increasing RAMP signal as shown at 135, and when low causes C1 to discharge resulting in a decreasing RAMP signal as shown at 136. The Vmin, Vmax, and Vsig signal levels are also shown in FIG. 3. As RAMP increases, RAMP crosses Vmin at 137, Vsig at 138, and Vmax at 139.

Upon assertion of the COMP_SEL to a logic high level in this example, switch S1 in FIG. 1 turns on (and S2 turns off) thereby providing Vmin to the negative input of comparator 122. Once RAMP exceeds Vmin, the VREF_COMP output signal from comparator 122 becomes high as shown at 141. At any point in time between RAMP exceeding Vmin and RAMP exceeding Vmax, the state machine 211 changes the logic state of COMP_SEL (depicted by falling edge 142) to thereby select Vmax to be provided to the negative input of comparator 122 for comparison to RAMP. With the higher voltage Vmax provided to the negative input of comparator 122 (and RAMP being less than Vmax), VREF_COMP transitions to a logic low level as illustrated at 143. At 138, RAMP crosses Vsig thereby causing the VSIG_COMP signal from comparator 124 to become low, as shown at 144.

As RAMP continues to increase, eventually RAMP crosses Vout at 139 thereby causing VREF_COMP to again become a logic high at 145.

The time value T1 represents the time it takes for RAMP to exceed Vsig from the point in time that RAMP exceeded Vmin (i.e., the time between crossing points 137 and 138). The time value T2 represents the time it take for RAMP to exceed Vmax from the point in time that RAMP exceeded Vmin (i.e., the time between 137 and 139). The T1 and T2 counters 212 and 213 count pulses of CLK to provide values indicative of the T1 and T2 time values. Thus, the T1 counter 212 counts the number of CLK pulses between points 137 and 138, and the T2 counter 213 counts the number of CLK pulses between points 137 and 139. The state machine 211 asserts control signals to start and stop the counters. That portion of the RAMP below Vmin (which may not be sufficiently linear) is not used in these calculations and the generation of the PWM output signal. The divider 214 computes the ratio of T1 to T2. This ratio thus represents the percentage of the time that RAMP is between Vmin and Vsig to the total amount of time that RAMP is between Vmin and Vmax. The ratio T1/T2 is multiplied by the period of the PWM output signal ($T_{PWM}$) by multiplier 215 to produce a product T3 that is used during a subsequent cycle of the PWM output signal (e.g., there is a 1 PWM clock cycle delay between computing T3 and using it to generate the PWM output signal). T3 represents the number of pulses of a clock signal (CLK) that occurs within a time period equal to $(T1/T2)*T_{PWM}$.

Figure 4:
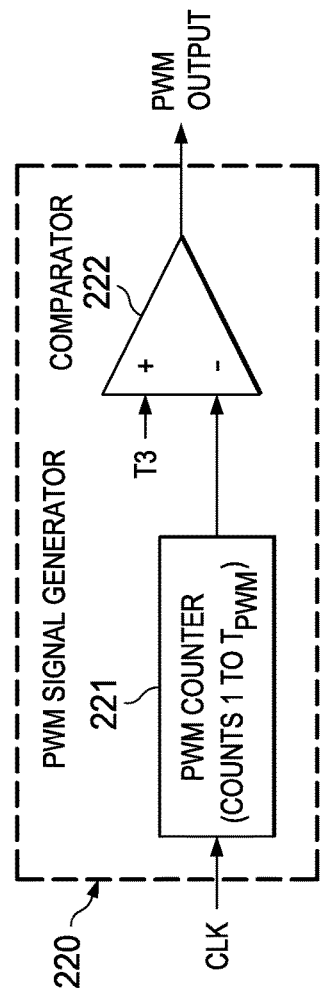
FIG. 4 provides a PWM signal generator of the illustrative digital core of FIG. 1.

The value of T3 is used by the PWM signal generator 220 to generate the PWM output signal during the next PWM cycle having a duty cycle equal to $T3/T_{PWM}$. FIG. 4 shows an example of the PWM signal generator 220. In this example, the PWM signal generator 220 includes a PWM counter 221, which counts pulses of CLK, coupled to a comparator 222. The output of the comparator 222 represents the PWM output signal and is a logic high (as depicted at 146 in FIG. 3) as T3 is greater than the count output by the counter 221. Once the count output from PWM counter 221 reaches T3, the output of the comparator 222 becomes a logic low as illustrated at 147 in FIG. 3. The duty cycle of the PWM cycle is T3/TPWM and is equal to T1/T2.

Figure 5:
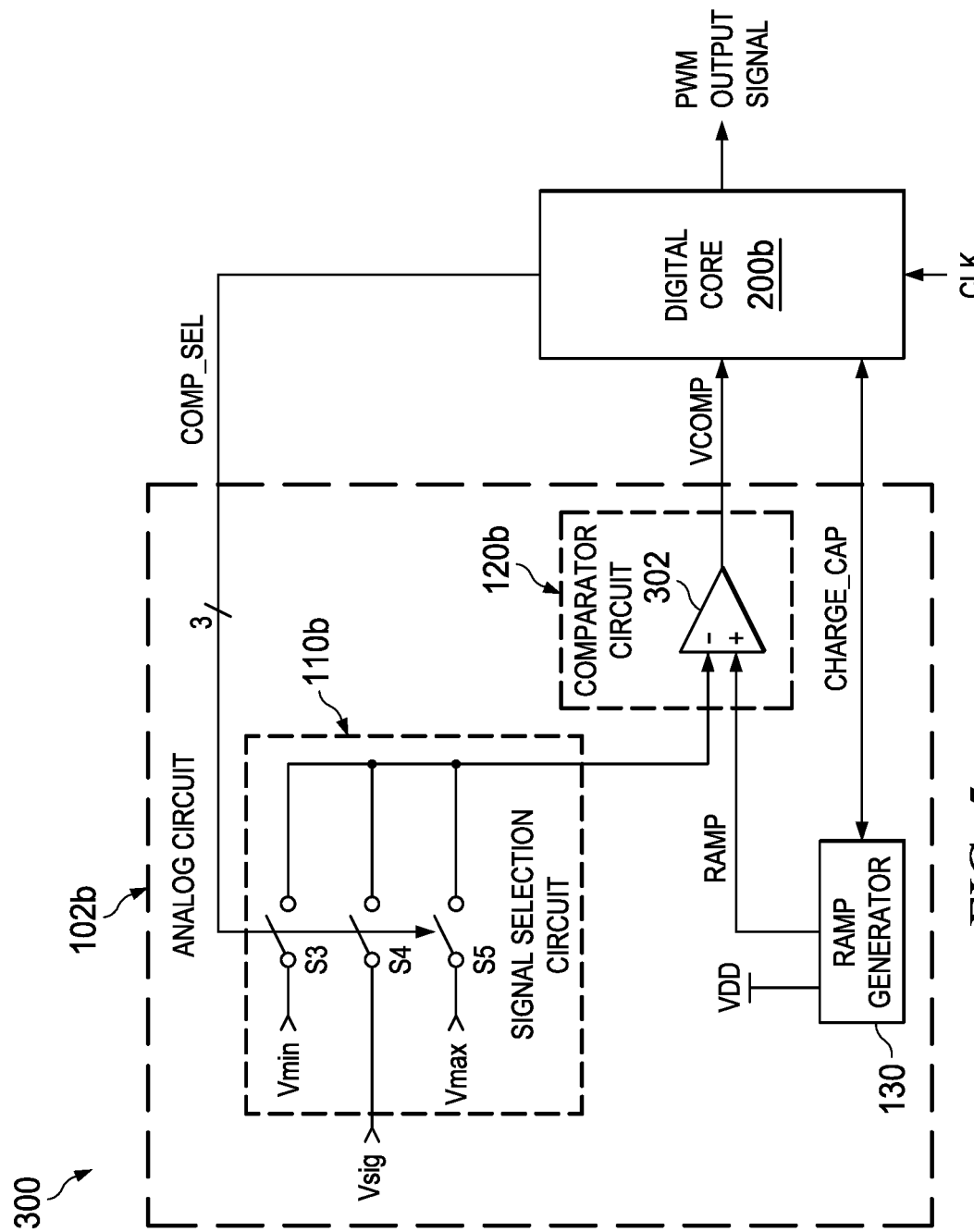
FIG. 5 illustrates another example of an analog-to-PWM converter including a signal selection circuit, a single comparator, and a digital core.

FIG. 5 shows another embodiment of an analog-to-PWM converter 300 comprising an analog circuit 102b coupled to a digital core 200b. In this embodiment, the analog circuit 102b includes a signal selection circuit 110b, a comparator circuit 120b, and the ramp generator 130. The ramp generator 130 may be implemented with the same or similar circuit as that shown in FIG. 1. The signal selection circuit 110b includes three switches S3, S4, and S5. Switch S3 is coupled to Vmin. Switch S4 is coupled to Vsig and switch S5 is coupled Vmax. The switches S3-S5 are controlled by COMP_SEL from the digital core 200b. COMP_SEL may comprise a separate control line for each of the switches.

The switches S3-S5 are used to selectively provide the Vmin, Vsig, and Vmax signals to the comparator circuit 120b. The comparator circuit 120b includes a single comparator 302 in this example which compares RAMP (provided to its positive input) to a selected one of the Vmin, Vsig, and Vmax voltages from the signal selection circuit 110b provided to the comparator's negative input. The output signal from the comparator 302 is designated as VCOMP. The logic level of VCOMP indicates whether RAMP is above or below the corresponding signal on the comparator's negative input (Vmin, Vsig, or Vmax depending on the state of COMP_SEL).

Figure 6:
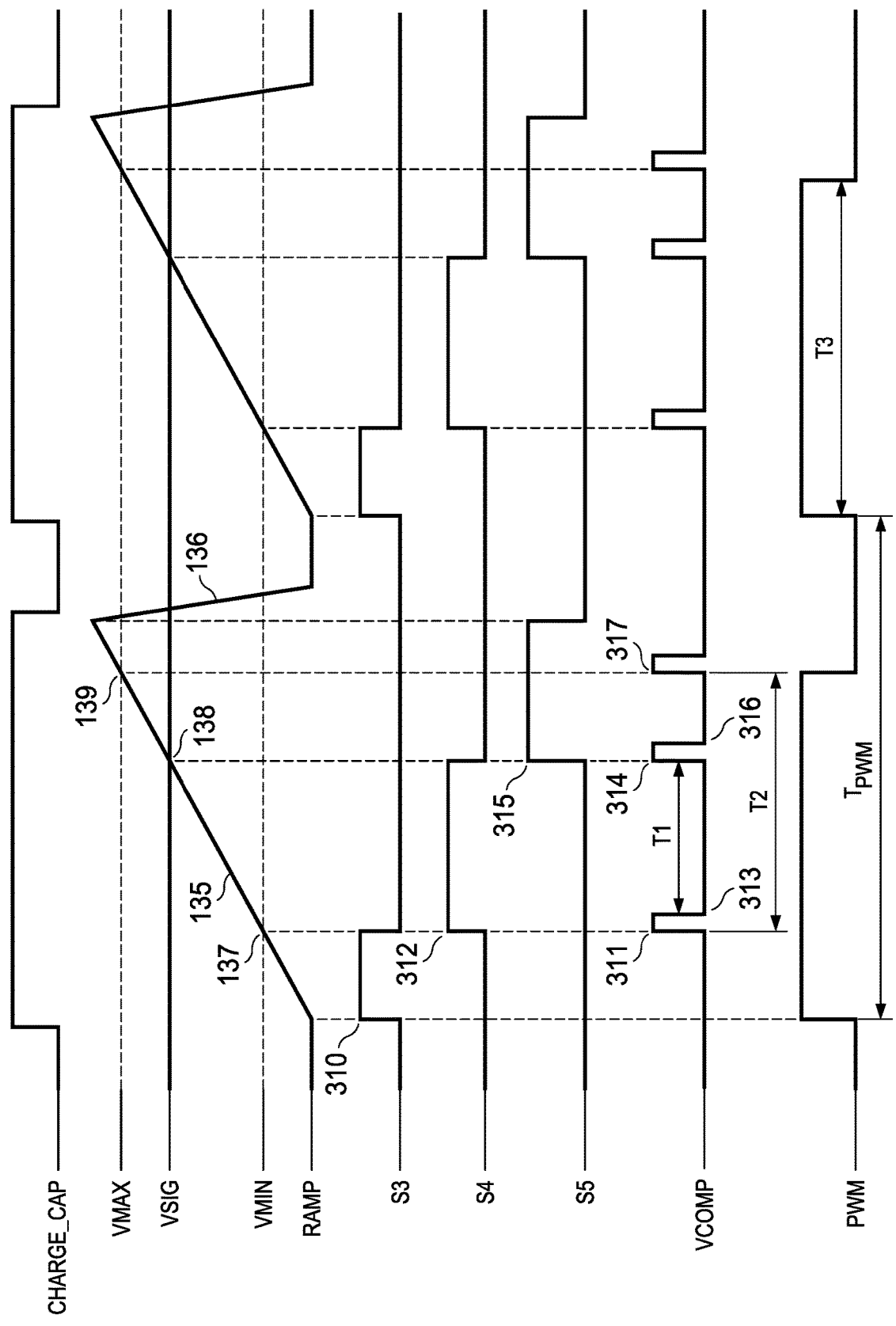
FIG. 6 is a timing diagram of the operation of the analog-to-PWM converter of FIG. 5 in accordance with an embodiment.

FIG. 6 is a timing diagram of the signals in the embodiment of FIG. 5. The CHARGE_CAP control signal is the same as in FIG. 3 and is used to control the switches of the ramp generator 130 to generate RAMP. The Vmin, Vmax, and Vsig signals also are shown in FIG. 6 in relation to the ramp signal. Initially, all three switches S3-S5 are off. At the beginning of the ramp signal's increase, resulting from CHARGE_CAP being asserted high to charge capacitor C1, switch S3 is turned on (by operation of COMP_SEL) as shown at 310. With S3 on, Vmin is provided to comparator 302 for comparison to RAMP. VCOMP (output of the comparator) is initially low as shown but becomes high at 311 once RAMP crosses Vmin at 137. Responsive to VCOMP going high, the digital core 200b turns off S3 and turns on S4 at 312 to thereby compare Vsig to RAMP. As a result of increasing the voltage on the comparator's negative input from Vmin to Vsig, VCOMP goes low as shown at 313. Once, however, RAMP crosses Vsig at 138, VCOMP again goes high as shown at 314.

Responsive to VCOMP going high at 314, the digital core 200b turns off S4 and turns on S5 at 315 to thereby compare Vmax to RAMP. As a result of increasing the voltage on the comparator's negative input from Vsig to Vmax, VCOMP goes low as shown at 316. Once RAMP crosses Vmax at 139, VCOMP again becomes high as shown at 317.

Figure 7:
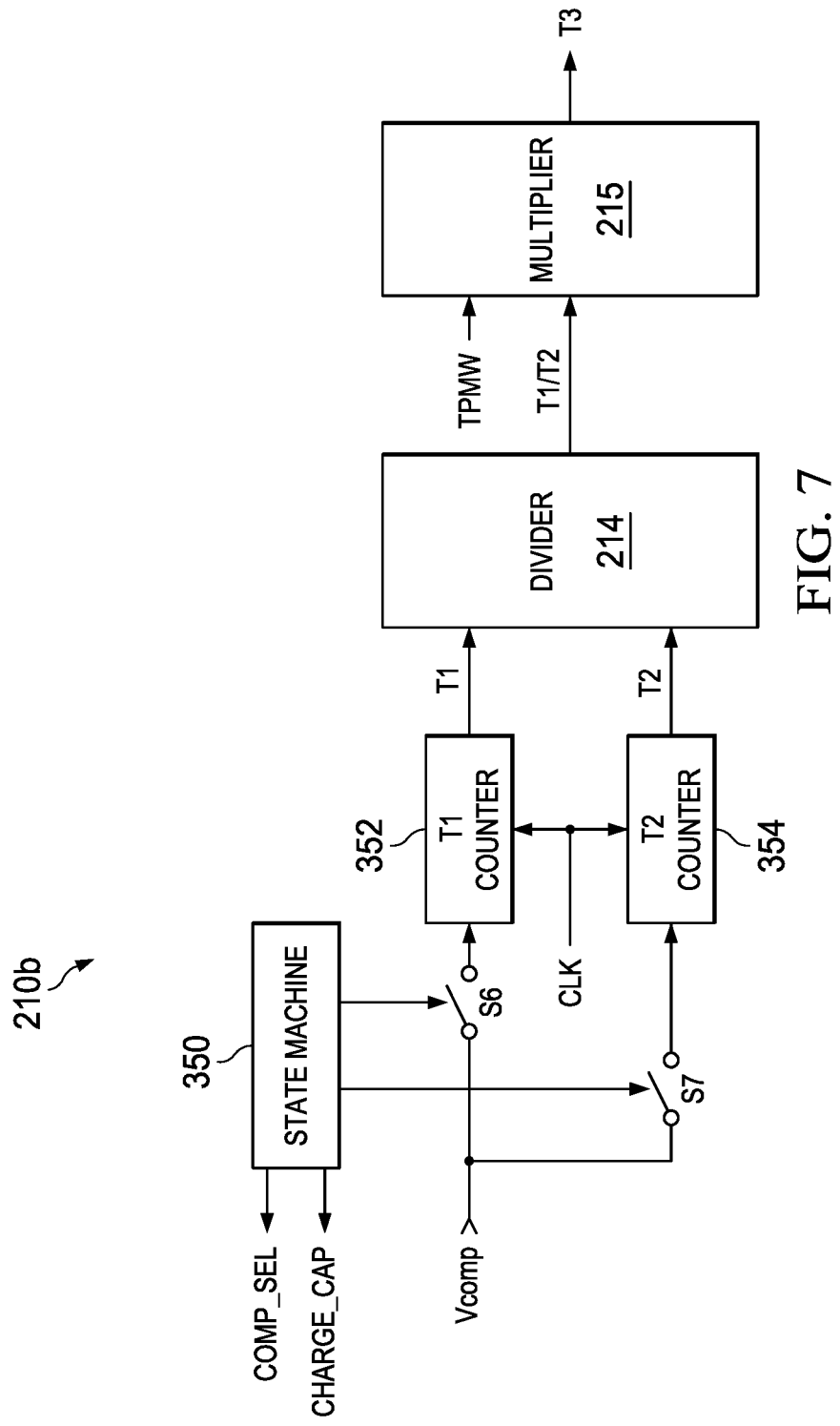
FIG. 7 is a duty cycle calculation circuit usable in the digital core of the example of FIG. 5.

T1 and T2 represent the same time periods as in FIG. 3 but are measured using consecutive pulses of a common VCOMP signal as shown. The digital core of FIG. 1 includes a duty cycle calculation circuit 210a. FIG. 7 shows an example of an implementation of a duty cycle calculation circuit 210b usable for the signal comparator embodiment of FIG. 5. The duty cycle calculation circuit 210b includes a state machine 350, T1 and T2 counters 352 and 354, divider 214, multiplier 215, and switches S6 and S7. The state machine 350 sequences through the various states and asserts the COMP_SEL and CHARGE_CAP control signals as described above. The T1 and T2 counters 352, 354 count pulses of CLK to produce the values of T1 and T2 to be divided by divider 214 and then multiplied by $T_{PMW}$ (the period of the PMW cycle) to produce T3. Switch S6 is coupled to T1 counter 352 and switch S7 is coupled to T2 counter 354. The switches S6 and S7 are controlled by control signals from the state machine 350 to selectively provide the VCOMP signal to the counters to start and stop the counters. As shown in the timing diagram of FIG. 6, T1 is the time between the first two consecutive pulses of VCOMP after RAMP begins to rise and once RAMP crosses Vmin. After RAMP crosses Vmin, the state machine asserts a control signal to turn on S4 (as described above) and to turn on S6 to start the T1 counter's counting process. Once RAMP crosses Vsig, the state machine turns off S6 to stop the T1 counter.

The state machine 350 also turns on S7 upon RAMP crossing Vmin to start the T2 counter 354. The state machine continues to keep S7 in an on state until RAMP crosses Vmax at which point the state machine 350 turns off S7 to stop the T2 counter 354. The duty cycle calculation circuit 210b is coupled to a PWM signal generator such as the PWM signal generator 220 of FIG. 4.

Figure 8:
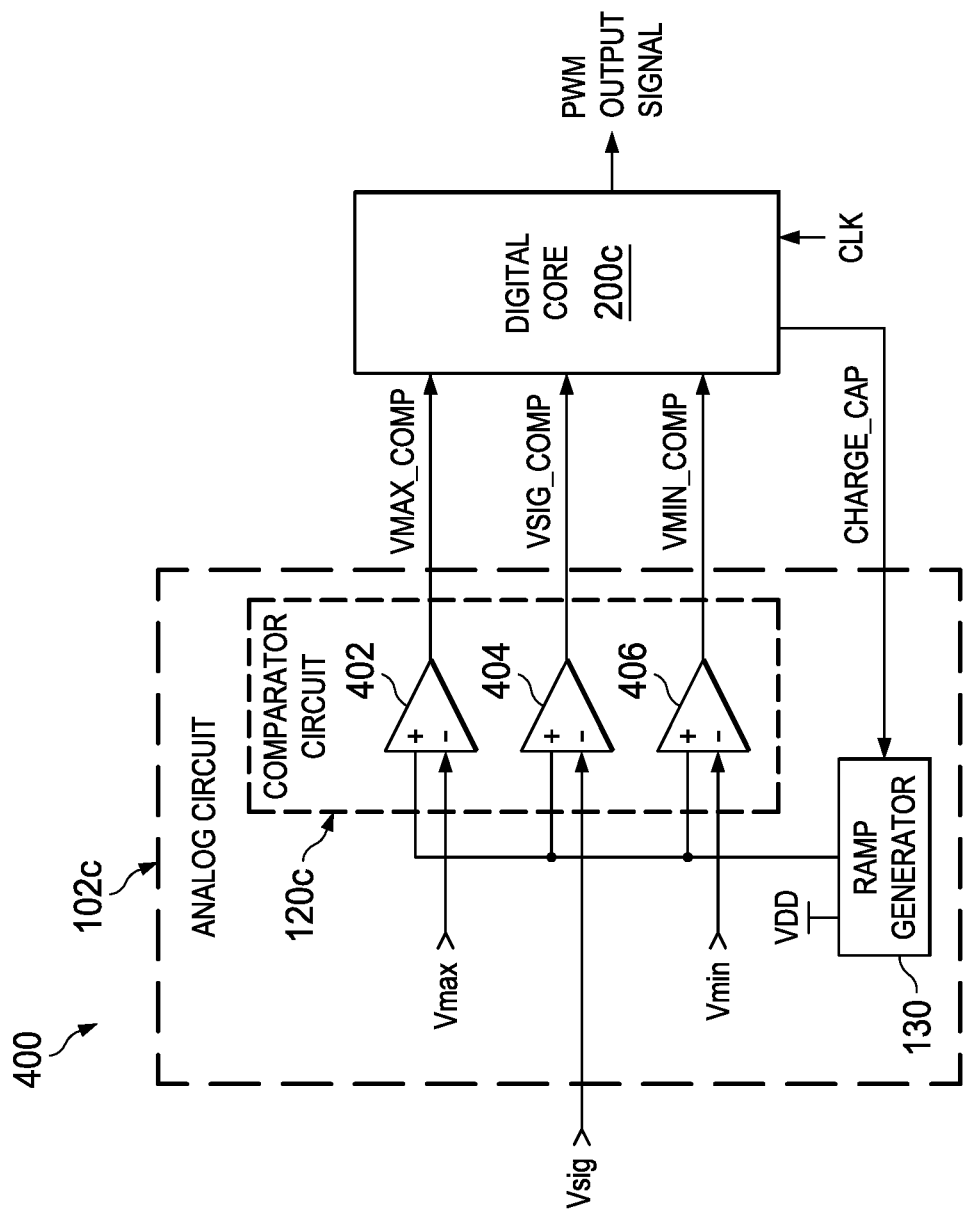
FIG. 8 illustrates yet another example of an analog-to-PWM converter including multiple comparators and a digital core with no signal selection circuit.

FIG. 8 shows another embodiment of an analog-to-PWM converter 400 comprising an analog circuit 102c coupled to a digital core 200c. The analog circuit 102c includes a comparator circuit 120c and the ramp generator 130. The comparator circuit 120c includes three comparators 402, 404, and 406—one comparator for each of Vmax, Vsig, and Vmin. Comparator 402 compares RAMP to Vmax. Comparator 404 compares RAMP to Vsig. Comparator 406 compares RAMP to Vmin. Because a separate comparator is used for each of the signals Vmax, Vsig, and Vmin, a signal selection circuit 110 is not included in this emobdiment. All three comparator output signals shown in FIG. 8 as VMAX_COMP, VSIG_COMP, and VMIN_COMP are provided to the digital core 200c for generation of the PWM output signal.

Figure 9:
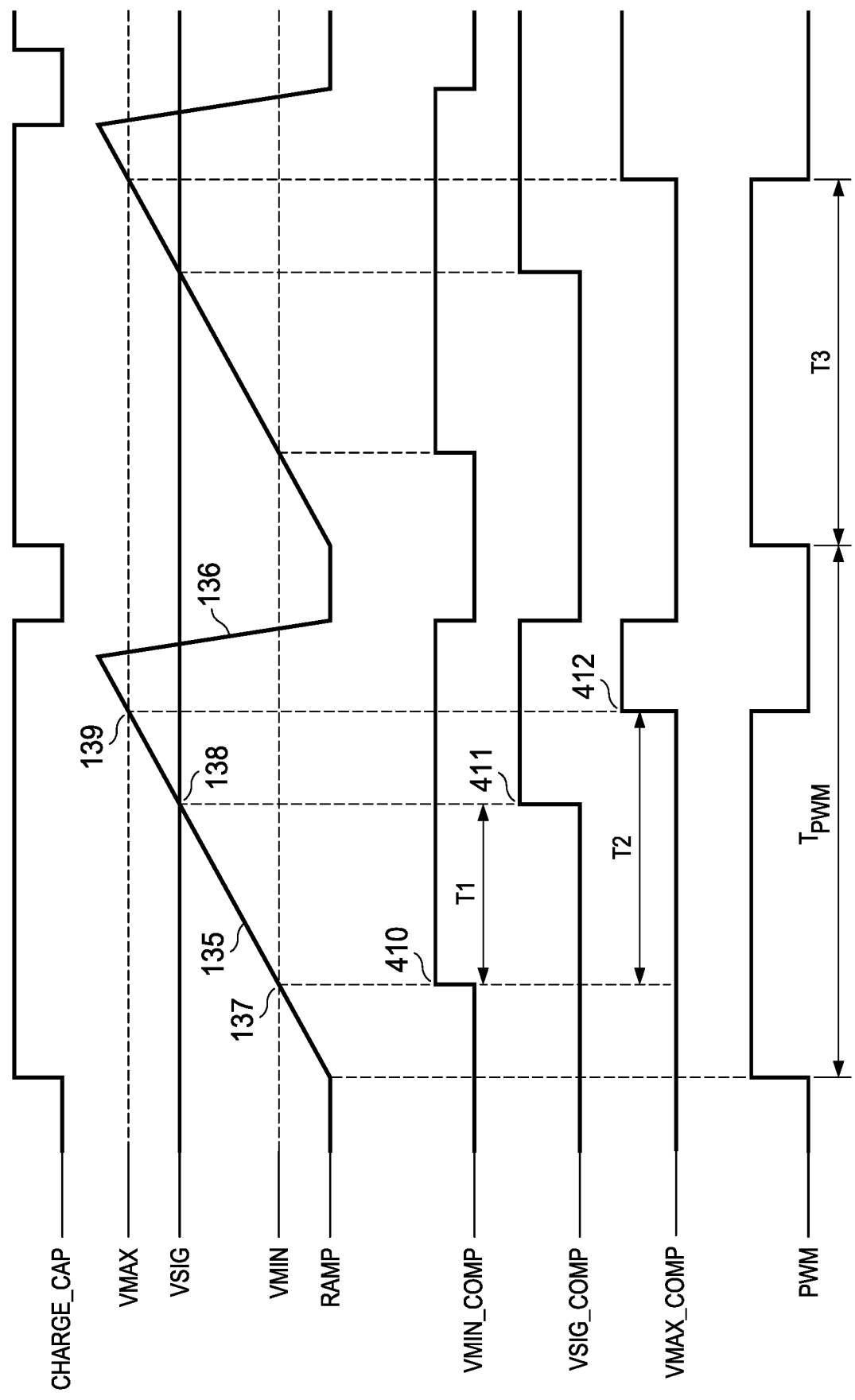
FIG. 9 is a timing diagram of the operation of the analog-to-PWM converter of FIG. 8 in accordance with an embodiment.

FIG. 9 illustrates the timing diagram corresponding to the operation of the analog-to-PWM converter 400. The VMIN_COMP signal is low initially until RAMP crosses Vmin (at 137) at which time VMIN_COMP is forced high at 410 by comparator 402. Similarly, the VSIG_COMP signal is low initially until RAMP crosses Vsig (at 138) at which time VSIG_COMP is forced high at 411 by comparator 404. The VMAX_COMP signal is low initially until RAMP crosses Vmax (at 139) at which time VMAX_COMP is forced high at 412 by comparator 406.

Figure 10:
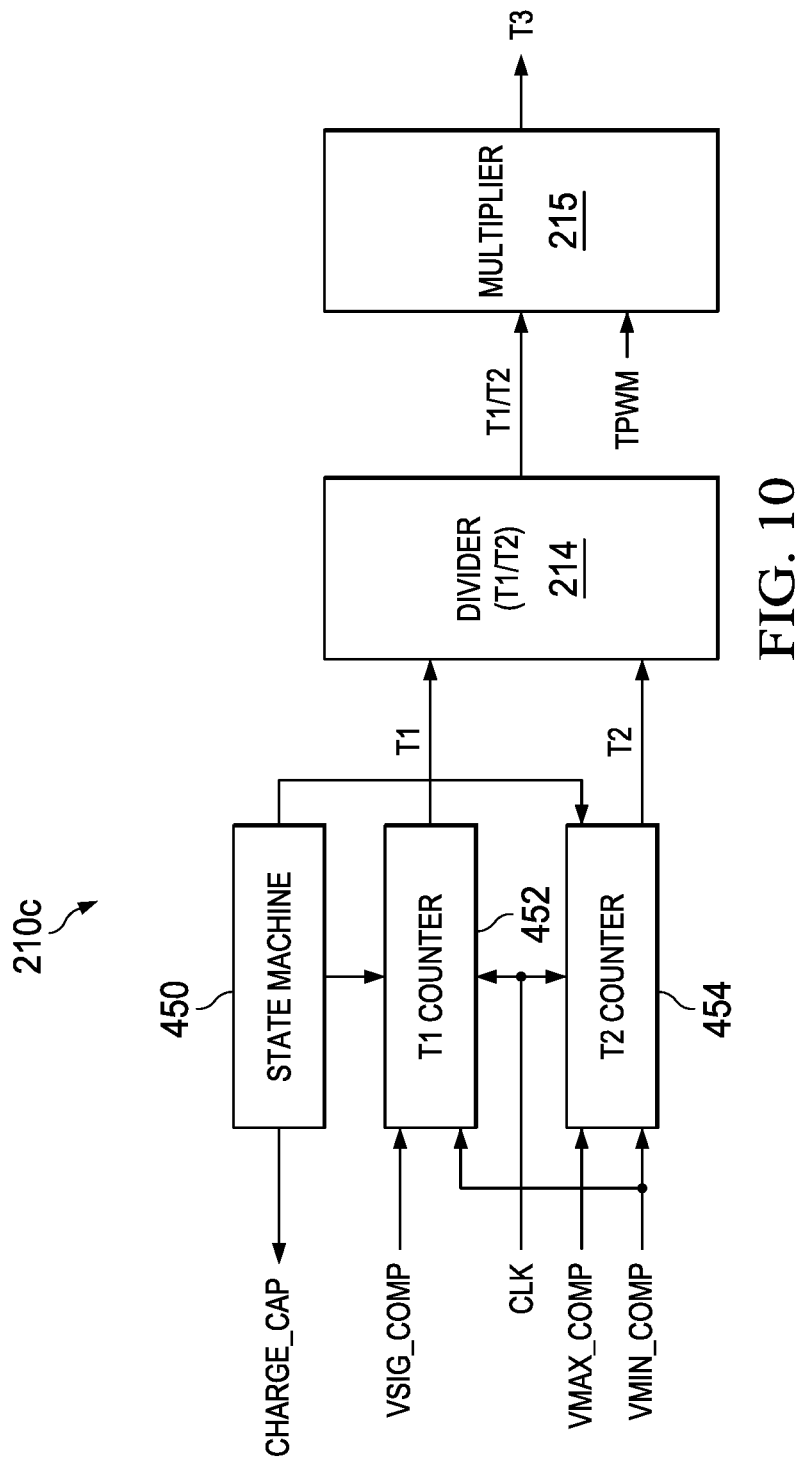
FIG. 10 is a duty cycle calculation circuit usable in the digital core of the example FIG. 8.

T1 is the time period between rising edges of VMIN_COMP and VSIG_COMP and T2 is the time period between rising edges of VMIN_COMP and VMAX_COMP. FIG. 10 illustrates an embodiment of a duty cycle calculation circuit 210c for use in the digital core 200c. The duty cycle calculation circuit 210c includes state machine 450, T1 and T2 counters 452, 454, divider 214, and multiplier 215. The T1 counter 452 counts pulses of CLK between the edges of VMIN_COMP and VSIG_COMP to produce the value T1, and the T2 counter 454 pulses of CLK between the edges of VMIN_COMP and VMAX_COMP to produce the value T2. The duty cycle calculation circuit 210c is coupled to a PWM signal generator such as the PWM signal generator 220 of FIG. 4.

Figure 11:
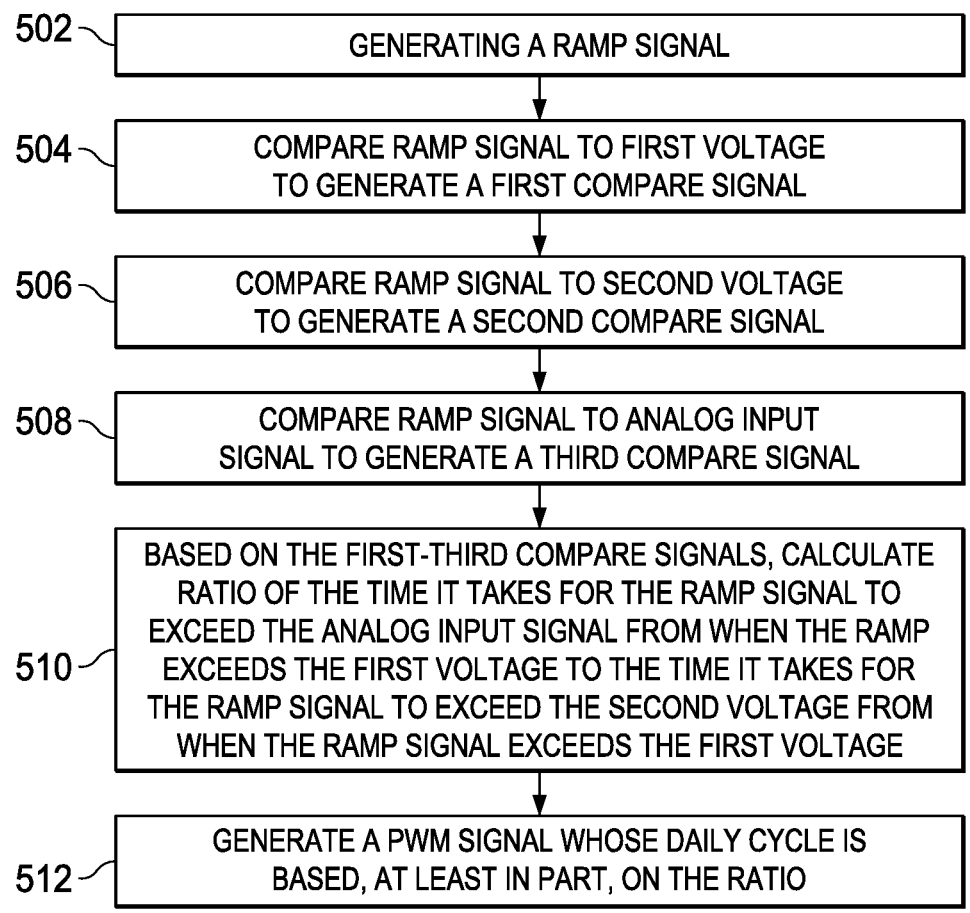
FIG. 11 is an example of a method for converting an analog input signal into a PWM output signal in accordance with the disclosed embodiments.

FIG. 11 illustrates a method of generating a PWM signal based on an analog input signal. The operations depicted in FIG. 11 can be performed in the order shown, or in a different order. Further, the operations can be performed sequentially, or two or more of the operations may be performed concurrently. The method shown can be performed using any of the embodiments described above.

At 502, the method includes generating a ramp signal. The generation of the ramp signal can be performed by coupling a constant current source through a switch to a capacitor to thereby charge the capacitor as described above. However, other circuit techniques for generating a ramp signal are possible as well.

At 504, the method includes comparing the ramp signal to a first voltage to generate a first compare signal. The first voltage comprises Vmin in some embodiments. A voltage comparator can be used to implement this operation. The method further includes at 506 comparing the ramp signal to a second voltage (e.g., Vsig) to generate a second compare signal and at 508 comparing the ramp signal to an analog input signal to generate a third compare signal (e.g., Vmax). One comparator can be used to compare the first and second voltages (Vmin and Vmax) to RAMP while another comparator compares RAMP to the analog input signal as in the example of FIG. 1. A single comparator as in the example of FIG. 5 can be used to perform all three comparisons, relying on a signal selection circuit to selectively provide the first and second voltages and the analog input signal to the comparator. Alternatively, three separate comparators can be used as in the example of FIG. 8. The first, second, and third compare signals may comprise voltages of one, two, or three different signal lines as explained in the preceding embodiments (e.g., VREF_COMP and VSIG_COMP as in FIG. 1, VCOMP as in FIG. 5, and VMIN_COMP, VSIG_COMP, and VMAX_COMP as in FIG. 8).

At 510, the method includes, based on the first, second and third compare signals, calculating a ratio of the time it takes for the ramp signal to exceed the analog input signal from when the ramp signal exceeds the first voltage to the time it takes for the ramp signal to exceed the second voltage from when the ramp signal exceeds the first voltage. In the examples above, the digital core 200a, 200b, 200c calculates this ratio, such as through the use of divider 214).

Finally, at 512, the method includes generating a PWM output signal based, at least in part, on the ratio. The PWM signal generator 220 described above is usable to perform this operation.

In the embodiments discussed above, a ramp signal is generated during each PWM cycle to be used to calculate T1, T2, and T3 for determination of the duty cycle of the PWM output signal. In other embodiments, multiple ramp signals are generated during each PWM signal by the ramp generator 130. A T1 time value and a T2 time value are determined using each such ramp signal (multiple sets of counters may be used—one set for each ramp signal). The ratio of T1 to T2 is calculated for each ramp signal by the divider 214 of the corresponding digital core, and the multiple T1/T2 ratios are averaged together to produce a value of T3 to be used as described above. References to the use of the ratio of the time (T1) it takes RAMP to exceed Vsig from when RAMP exceeds Vmax to the time (T2) it takes for RAMP to exceed Vmin (i.e., the ratio T1/T2) includes a single calculation of T1/2 or an average of multiple calculations of T1/T2 generated based on multiple ramp signals.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A process comprising:
   generating a ramp signal;
   comparing the ramp signal to a first voltage to generate a first compare signal;
   comparing the ramp signal to a second voltage to generate a second compare signal;
   comparing the ramp signal to an analog input signal to generate a third compare signal;
   based on the first, second and third compare signals, calculating a ratio of a first time to a second time, the first time being from the ramp signal exceeding the first voltage to the ramp signal exceeding the analog input signal, and the second time being from the ramp signal exeeding the first voltage to the ramp signal exeeding the second volatge; and
   generating a PWM output signal based, at least in part, on the ratio.

2. The process of claim 1 in which the first voltage is less than or equal to the analog input signal and the second voltage is greater than or equal to the analog input signal.

3. The process of claim 1 including, based on a control signal, selecting between the first and second voltages to be provided to a comparator for comparison to the ramp signal.

4. The process of claim 1 including based on a control signal, selecting between the first voltage, the second voltage, and the analog input signal to be provided to a comparator for comparison to the ramp signal.

5. A process comprising:
   producing a ramp signal that increases in voltage with time;
   producing a first signal representing a first time by comparing the ramp signal to a first voltage and to an analog signal having an analog voltage;
   producing a second signal representing a second time by comparing the ramp signal to the first voltage and to a second voltage;
   producing a third signal representing a ratio of the first and second times by dividing the time represented by the first signal by the time represented by the second signal;
   producing a fourth signal representing a third time by multiplying the third signal by a fifth signal that represents a period of a pulse width modulating output signal; and
   producing a pulse width modulation signal representing the voltage of the analog signal in response to the fourth signal.

6. The process of claim 5 in which the comparing the ramp signal to a first voltage and to an analog signal includes comparing the ramp signal to a first voltage that is less than the voltage of the analog input signal.

7. The process of claim 5 in which the comparing the ramp signal to the first voltage and to a second voltage includes comparing the ramp signal to the first voltage that is less than the voltage of the analog input signal and to the second voltage that is greater than the voltage of the analog input signal.

8. The process of claim 5 in which producing the first signal includes counting clock pulses from the time the ramp signal voltage equals the first voltage until the ramp signal voltage equals the analog voltage.

9. The process of claim 5 in which producing the second signal includes counting clock pulses from the time the ramp signal voltage equals the first voltage until the ramp signal voltage equals the second voltage.

10. The process of claim 5 in which the producing a ramp signal that increases voltage with time includes controlling the ramp signal with an output of a state machine.

11. The process of claim 5 in which the producing a ramp signal that increases voltage with time includes controlling the ramp signal with an output of a state machine that switches a capacitor between a current source and circuit ground.

12. The process of claim 5 in which the comparing the ramp signal to the first voltage and to a second voltage includes controlling the comparing with an output of a state machine.

13. The process of claim 5 in which the comparing the ramp signal to the first voltage and to a second voltage includes controlling the comparing with an output of a state machine by switching the first voltage and the second voltage to an input of a comparator.

14. The process of claim 5 in which the comparing the ramp signal to a first voltage and to an analog signal and the comparing the ramp signal to the first voltage and to a second voltage includes controlling the comparing with an output of a state machine.

15. The process of claim 5 in which the comparing the ramp signal to a first voltage and to an analog signal and the comparing the ramp signal to the first voltage and to a second voltage includes controlling the comparing with an output of a state machine by switching the first voltage, the analog signal, and the second voltage to a comparator.

* * * * *